United States Patent
Tsumura

(10) Patent No.: US 9,472,547 B2
(45) Date of Patent: Oct. 18, 2016

(54) SEMICONDUCTOR DEVICE

(71) Applicant: SEIKO INSTRUMENTS INC., Chiba-shi, Chiba (JP)

(72) Inventor: Kazuhiro Tsumura, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/987,528

(22) Filed: Jan. 4, 2016

(65) Prior Publication Data

US 2016/0211256 A1 Jul. 21, 2016

(30) Foreign Application Priority Data

Jan. 16, 2015 (JP) .................................. 2015-007228

(51) Int. Cl.
*H01L 27/06* (2006.01)
*H01L 29/78* (2006.01)
*H01L 49/02* (2006.01)

(52) U.S. Cl.
CPC ........... *H01L 27/0629* (2013.01); *H01L 28/20* (2013.01); *H01L 29/7819* (2013.01)

(58) Field of Classification Search
CPC ........... H01L 27/0629; H01L 27/0647; H01L 28/20; H01L 29/7819; G01K 7/01; G01K 7/16; G01K 2007/163
See application file for complete search history.

(56) References Cited

U.S. PATENT DOCUMENTS

| | | | | |
|---|---|---|---|---|
| 4,760,434 A * | 7/1988 | Tsuzuki | .................. | H01L 23/34 257/328 |
| 5,521,421 A * | 5/1996 | Furuhata | ............. | H01L 29/7803 257/108 |
| 7,307,328 B2 * | 12/2007 | Meyer | ...................... | G01K 7/01 257/370 |
| 7,507,023 B2 * | 3/2009 | Oyabe | .................... | G01K 7/015 327/512 |
| 8,089,134 B2 * | 1/2012 | Yoshikawa | ......... | H01L 27/0255 257/467 |
| 8,796,807 B2 * | 8/2014 | Stephan | .............. | H01L 27/1203 257/467 |

* cited by examiner

*Primary Examiner* — Jose R Diaz
(74) *Attorney, Agent, or Firm* — Adams & Wilks

(57) ABSTRACT

A power element and a temperature sensing element are formed on the same semiconductor substrate, and one end of a PN junction of the temperature sensing element is connected to a ground potential (VSS) or a power supply potential (VDD) through an intermediation of a resistor. A sum of a potential difference between both ends of the PN junction and a potential difference between both ends of the resistor is used as a temperature detection signal. The temperature sensing element can thus be formed in a recess formed in the power element while avoiding latch-up.

11 Claims, 5 Drawing Sheets

SEMICONDUCTOR DEVICE

BACKGROUND OF THE INVENTION

1. Field of the Invention

The present invention relates to a semiconductor device having a function of overheat detection.

2. Description of the Related Art

A semiconductor integrated circuit generates heat due to, for example, an operation of active elements and charges flowing into the semiconductor integrated circuit from outside thereof. A temperature sensing element is thus formed on the same substrate as the semiconductor integrated circuit to control the semiconductor integrated circuit based on a signal from the temperature sensing element, to thereby prevent abnormal operation and breakdown of the circuit due to overheating. As the temperature sensing element, for example, a PN junction is used, and the forward current of the PN junction is used for temperature sensing. To be specific, when a constant current flows through a PN junction in a forward direction, a potential difference appears between the both ends of the PN junction. The potential difference changes depending on, temperature, and hence the potential difference is used as a signal for overheat detection.

In the field of semiconductor integrated circuits, downsizing has been promoted. Because a temperature increase of a semiconductor integrated circuit increases in inverse proportion to an area thereof, a local temperature increase has become intense along with the promotion of downsizing in recent years. As an amount of locally generated heat increases, a temperature sensed by a temperature sensing element increases depending on a substance between a heat generating source and the temperature sensing element, and a positional relationship therebetween. There may be two methods to be employed in order to solve this problem, to thereby correctly estimate the temperature of the heat generating source. Specifically, the heat generating source and the temperature sensing element are formed as close as possible, and a highly heat conductive substance is formed between the heat generating source and the temperature sensing element.

When the temperature sensing element is formed on the same substrate as the heat generating source, problematic operation, namely, parasitic operation occurs as described in Japanese Patent No. 2701824 as a problem. Due to this problem, the heat generating source and the temperature sensing element cannot be formed closely. In view of this, a method disclosed in Japanese Patent No. 2701824 involves forming an insulating film between a heat generating source and a temperature sensing element, to thereby avoid a problem of a parasitic element. Silicon is most commonly used as a substrate and a silicon dioxide film is most commonly used as an insulating film in semiconductor devices. The heat generating source and the temperature sensing element can be formed closely with the silicon dioxide film formed therebetween, which serves as the insulating film. In this case, however, because heat conductivity of a silicon dioxide film is smaller than that of silicon, it takes time for the temperature sensing element to follow the temperature of the heat generating source.

In short, a semiconductor device in which a temperature sensing element is formed on the same substrate as a heat generating source is disadvantageous in distance but is advantageous in heat conduction. On the other hand, a semiconductor device in which a heat generating source and a temperature sensing element are isolated from each other by an insulating film is advantageous in distance but is disadvantageous in heat conduction.

SUMMARY OF THE INVENTION

The present invention has been made in view of the above-mentioned problem, and provides a semiconductor device capable of reducing a temperature difference between a heat generating source and a temperature sensing element.

In order to solve the above-mentioned problem, according to one embodiment of the present invention, there is provided a semiconductor integrated circuit, including:

a power element potentially broken down due to heat generated with a current flowing therethrough when the power element is in a conductive state; and a temperature sensing element configured to detect temperature, the power element and the temperature sensing element being formed on the same semiconductor substrate, the temperature sensing element including a PN junction, the PN junction including a P-type region and an N-type region, one of the P-type region and the N-type region being connected to one of a ground potential VSS and a power supply potential VDD through an intermediation of a resistor, in which a sum of a potential difference between both ends of the PN junction and a potential difference between both ends of the resistor is used as a temperature detection signal.

According to the one embodiment of the present invention, the power element and the PN junction of the temperature sensing element may be formed more closely than in the related art, which means that a temperature difference therebetween is small.

Further, the heat generating source and the temperature sensing element may be formed closely, and hence even when part of the power element is recessed to form a recess and only the temperature sensing element according to the one embodiment of the present invention is formed in the recessed region, an increase in area of the semiconductor device is small. In one arrangement, the temperature sensing element is surrounded by the heat generating source in three directions. With this, because the heat generating source has a highest temperature in the vicinity of the center of the heat generating source, there is an advantage in that a temperature difference between a highest temperature of the heat generating source and a temperature of the temperature sensing element is reduced. The arrangement in which the temperature sensing element is surrounded by the heat generating source in three directions is an example, and the same effect may be obtained with an arrangement in which the temperature sensing element is formed at corners of the heat generating source so as to be surrounded thereby in two directions or an arrangement in which the temperature sensing element is formed in the vicinity of the center of the heat generating source so as to be surrounded thereby in all directions. Note that, a degree of the effect differs depending on the arrangements.

The following is found when the present invention and the related art in which a temperature sensing element is formed of polycrystalline silicon are compared to each other. The temperature sensing element formed of polycrystalline silicon is formed above a semiconductor substrate through an intermediation of an insulating film. Heat conductivity of the insulating film is smaller than that of the semiconductor substrate. Thus, there is an effect that, when a distance from the heat generating source is the same, a temperature difference between the heat generating source and the temperature sensing element may be reduced more with the temperature sensing element of the present invention than with the temperature sensing element formed of polycrystalline silicon.

BRIEF DESCRIPTION OF THE DRAWINGS

FIG. 1A is an arrangement plan view and FIG. 1B is a sectional view.

FIG. 2A is an arrangement plan view and FIG. 2B is a sectional view.

DETAILED DESCRIPTION OF THE INVENTION

Modes for carrying out the present invention are described below by way of embodiments with reference to the drawings.

First Embodiment

Figure 1A:
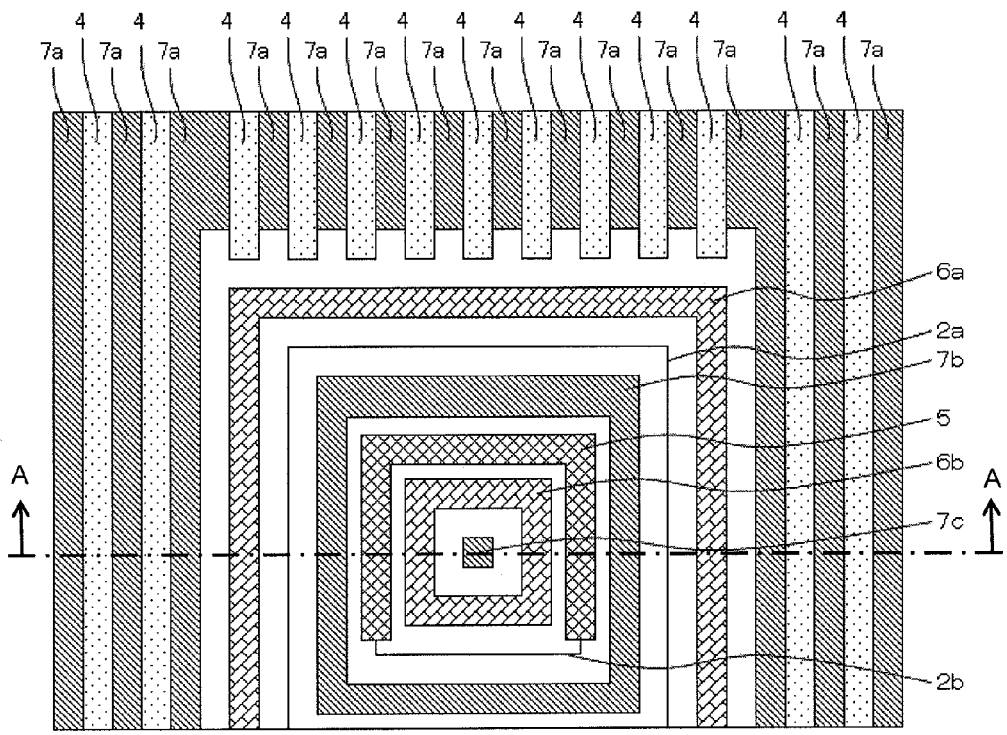
FIG. 1A and FIG. 1B are views of a power element and a temperature sensing element of the present invention.
Figure 1B:
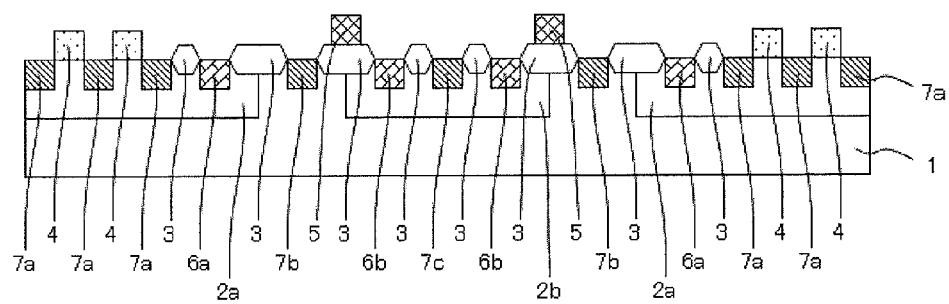

FIG. 1A is a plan view of a semiconductor device of the present invention. FIG. 1B is a structural sectional view taken along the line A-A of FIG. 1A. An N well 2a of a P-type MOS power element serving as a power element, and an N well 2b of a temperature sensing element are formed in a P-type semiconductor substrate 1.

In the N well 2a of the P-type MOS power element, a source/drain 7a and a gate electrode 4 of the P-type MOS power element, and an N-type high concentration region 6a of the N well of the P-type MOS power element are formed.

In the N well 2b of the temperature sensing element, a P-type high concentration region 7c of the temperature sensing element, and an N-type high concentration region 6b of the N well of the temperature sensing element are formed. The N-type high concentration region 6b and the P-type high concentration region 7c are isolated from each other by an element isolation region 3. A resistor 5 is formed on the element isolation region between the N-type high concentration region 6b and a P-type high concentration region 7b of the P-type semiconductor substrate. In the arrangement of FIG. 1A and FIG. 1B, the temperature sensing element has a rectangular shape and is surrounded by the P-type MOS power element in three directions. It may also be said that an outer profile of the P-type MOS power element defining an outer shape thereof conforms to three sides of the rectangular shape. Thus, the P-type MOS power element has a rectangular recess so that the temperature sensing element is formed therein. In the recess in which the temperature sensing element is formed and accommodated, none of the N well 2a, the source/drain 7a, the gate electrode 4, and the N-type high concentration region 6a of the P-type MOS power element's N well of the P-type MOS power element is formed.

In this embodiment, the three sides of the rectangular temperature sensing element are surrounded by the P-type MOS power element. However, the temperature sensing element may be surrounded by the P-type MOS power element in two or four directions, or two or four sides of the temperature sensing element may be surrounded by the P-type MOS power element.

Figure 3:
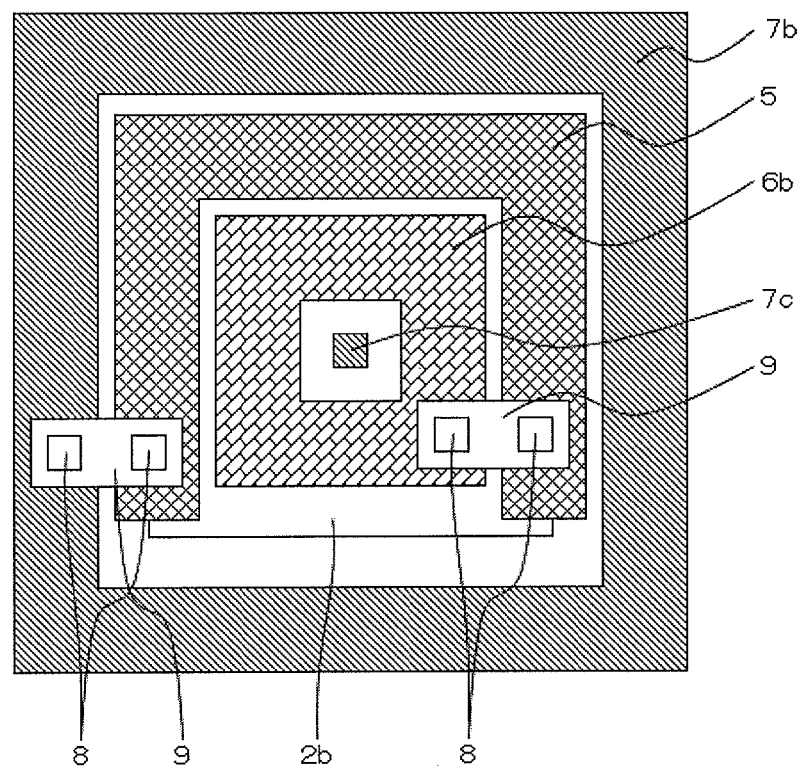
FIG. 3 is an enlarged arrangement plan view of the temperature sensing element region of the present invention.

FIG. 3 is an enlarged view of the temperature sensing element region of FIG. 1A, for illustrating wiring of the resistor. Contacts 8 are formed at both ends of the resistor 5, and one end and the other end of the resistor are connected, via metal wiring 9, to the P-type high concentration region 7b of the P-type semiconductor substrate, and the N-type high concentration region 6b of the N well 2b of the temperature sensing element, respectively.

Figure 2A:
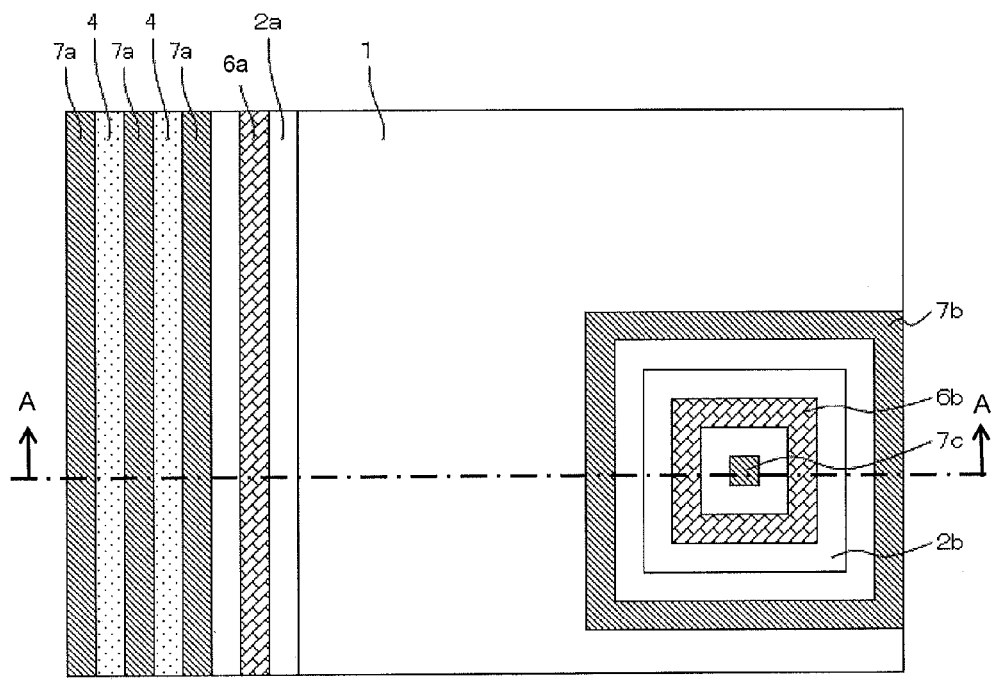
FIG. 2A and FIG. 2B are views of a power element and a temperature sensing element of the related art.
Figure 2B:
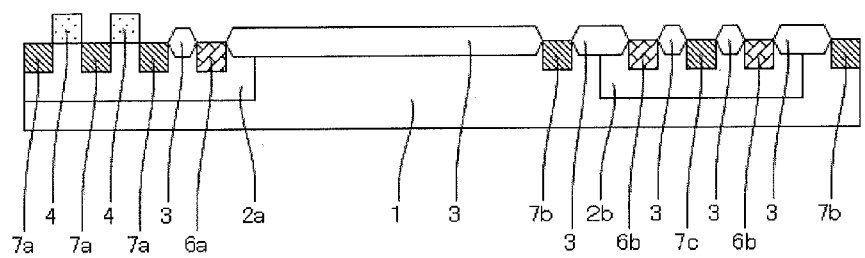

For comparison, a case in the related art is described with reference to FIG. 2A and FIG. 2B. FIG. 2A is a plan view of a semiconductor device of the related art. FIG. 2B is a structural sectional view taken along the line A-A of FIG. 2A. A P-type high concentration region 7b of a P-type semiconductor substrate and an N-type high concentration region 6b of an N well of a temperature sensing element are electrically connected to each other via metal wiring (not shown) and a contact (not shown) without any resistor. When the temperature sensing element is formed on the same substrate as a P-type MOS power element serving as a heat generating source, problematic operation, namely, parasitic operation occurs as described in Japanese Patent No. 2701824 as a problem. Thus, the two components cannot be formed closely in the related art. Thus, as illustrated in FIG. 2B, it is required to secure a sufficient distance between the P-type MOS power element and the temperature sensing element and form an element isolation region 3 therebetween.

A specific mechanism of the parasitic operation is described. In FIG. 1B and FIG. 2B, in general, the source and the N well 2a of the P-type MOS power element are connected to a power supply potential VDD. The P-type semiconductor substrate 1 is connected to a ground potential VSS. In FIG. 2B, as described above, the P-type high concentration region 7b of the P-type semiconductor substrate and the N-type high concentration region 6b of the N well of the temperature sensing element are electrically connected to each other, and hence the N well 2b is electrically connected to the ground potential VSS.

A P-type region 7a serving as the source connected to the power supply potential VDD, the N well 2a, the P-type semiconductor substrate 1, and the N well 2b connected to the ground potential VSS correspond to a PNPN structure. Both the ends are connected to the power supply potential VDD and the ground potential VSS, respectively, and hence inter-power supply latch-up may occur through this path. In general, this latch-up easily occurs when both the ends, namely, 7a and 2b, are close to each other and hardly occurs when both the ends are far from each other. A semiconductor device may be broken down due to latch-up, and hence, in the related-art semiconductor device, the two components have been formed apart from each other in order to avoid latch-up.

The present invention also has a PNPN structure in which latch-up may occur through the same path. However, the resistor is formed between the P-type semiconductor substrate 1 and the N well 2b. Thus, when current flows through this path, a potential of the N well 2b becomes higher than the ground potential VSS by "resistance value of resistor 5"×current"="voltage". This corresponds to applying a potential difference to the PN junction in a reverse direction, and hence such a large current that causes a breakdown of the semiconductor device does not flow through this path. Thus, in the present invention, it is no longer required to form 7a and 2b apart from each other to avoid latch-up, unlike the related art. This means that an area of the semiconductor device is reduced, and at the same time, that a temperature difference between the power element serving as the heat generating source and the temperature sensing element is small.

Both in the related art and in the present invention, a signal from the temperature sensing element is a potential of the P-type high concentration region 7c of the temperature sensing element. To be a little more specific, a potential difference between a potential of 7c and the ground potential VSS is a signal from the temperature sensing element. In the present invention, this signal is a sum of a potential difference at the PN junction of the temperature sensing element and a voltage applied to the resistor 5. The voltage applied to the resistor 5 is a product of a current to be caused to flow through the PN junction and a resistance value of the resistor.

In order to prevent the power element from being broken down due to heat, it is required to reduce a sum of a first error that is a difference between a temperature at a highest temperature point and a temperature at the temperature sensing element, and a second error that is a temperature measurement error of the temperature sensing element.

In the present invention in which the power element and the temperature sensing element are formed on the same substrate, compared to each of the related art in which the two components are formed apart from each other to avoid parasitic operation, and the related art in which the temperature sensing element is formed of polycrystalline silicon, the first error is smaller and the second error is the same.

An amount of heat generated per unit area has been increasing along with the trend of downsizing in recent years. Thus, the first error has become significantly larger than the second error. The present invention copes with this problem.

Second Embodiment

Temperature sensitivity of the PN junction of the temperature sensing element is about 2 mV/° C. A current that is caused to flow through the PN junction of the temperature sensing element is generally from 0.1 µA to 10 µA in many cases. The second error described in the first embodiment is caused due to a voltage applied to the resistor, and hence a larger resistance value and a larger current lead to a larger second error. Thus, the maximum value of the resistance value is obtained based on an allowable second error.

The allowable value of the second error is about 10° C. at the maximum. The maximum value is calculated with the allowable value and the minimum current as 2 mV/° C.×10° C./0.1 µA=200 kΩ.

The minimum value of the resistor is determined based on whether parasitic operation can be prevented with the value. It was found through investigation that at least 50Ω is required to provide a satisfactory prevention effect. From the foregoing, the resistance value is from 50Ω or more to 200 kΩ or less.

Third Embodiment

When the resistor is a diffused resistor, the resistor is a factor that causes parasitic operation. Thus, it is desired that the resistor be a resistor that is isolated from the semiconductor substrate by an insulator. The most common material satisfying this condition is polycrystalline silicon. A resistance value of polycrystalline silicon can not only be changed by changing a width and a length thereof, but also be changed by changing an impurity concentration thereof. Thus, polycrystalline silicon is most suitable for obtaining a desired resistance value. FIG. 1B is equivalent to a sectional view of the semiconductor device in which polycrystalline silicon is used as the resistor.

Fourth Embodiment

A description is made with reference to FIG. 1A again. The P-type region of the temperature sensing element is surrounded by the N well 2b, which is a region having the other polarity. This structure is necessary for forming the PN junction. If the P-type region is not surrounded by the N well 2b, the P-type region of the temperature sensing element and the P-type semiconductor substrate are short-circuited.

The N well 2b is an element that potentially causes parasitic operation, and is thus generally surrounded by the P-type high concentration region 7b of the P-type semiconductor substrate. The N well 2b of the temperature sensing element is connected to the ground potential VSS through an intermediation of the resistor. When the resistor is formed so as to be sandwiched between the N-type high concentration region 6b of the N well of the temperature sensing element, and the P-type high concentration region 7b having the ground potential VSS, the length of metal wiring can be reduced as illustrated in FIG. 3, which is preferred.

Further, the element isolation region is required to be formed between 6b and 7b, and the element isolation region is suitable for forming the resistor thereon.

Fifth Embodiment

The resistor of the present invention is formed in the vicinity of an output element of the semiconductor device, and is thus potentially broken down due to a large current transitionally flowing therethrough. This breakdown can be suppressed by increasing a volume of the resistor. Thus, it is preferred to form the resistor as large as possible with which the size of the semiconductor device does not increase, rather than forming the resistor having the minimum width and a length required for obtaining a required resistance value. As a region for isolation, it is required to secure a distance between the N-type high concentration region 6b of the N well of the temperature sensing element, and the P-type high concentration region 7b having the ground potential VSS. A largest resistor capable of being formed in this region is formed so that a breakdown resistance of the semiconductor device can be increased without increasing the entire size of the semiconductor device.

It is desired that the resistor and the high concentration region be isolated from each other, and hence the width of the resistor is ½ or more of the distance between the N-type high concentration region 6b of the N well of the temperature sensing element, and the P-type high concentration region 7b having the ground potential VSS. This is a rough indication.

Sixth Embodiment

A positional relationship between a temperature sensing element 11 and a power element 12 is described with reference to FIG. 4A to FIG. 4D.

Figure 4A:
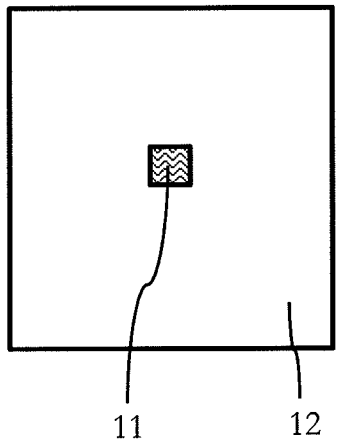
FIG. 4A to FIG. 4D are arrangement plan views for illustrating a positional relationship between the power element and the temperature sensing element of the present invention.

The temperature sensing element is formed at the center of the power element in FIG. 4A.

Figure 4B:
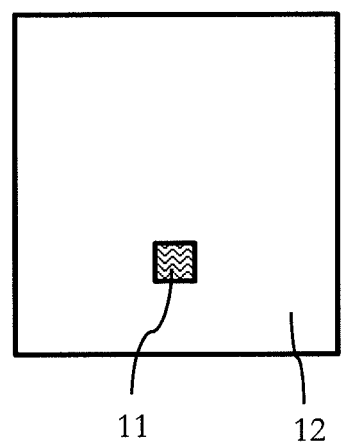

The temperature sensing element is formed at a position slightly shifted from the center of the power element in FIG. 4B.

Figure 4C:
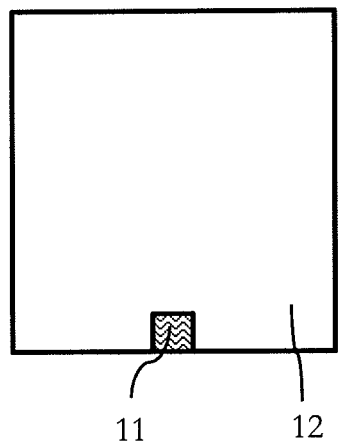

The temperature sensing element is formed so that three sides thereof are surrounded by the power element in FIG. 4C.

Figure 4D:
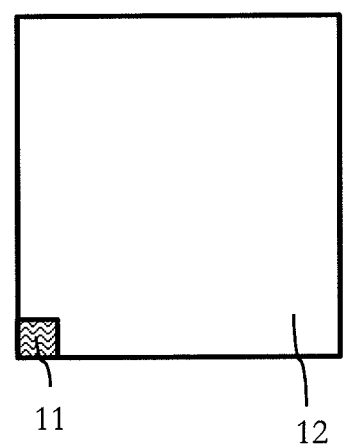

The temperature sensing element is formed in the vicinity of a vertex of the power element in FIG. 4D.

In the configuration of the related art in which the power element and the temperature sensing element are formed on the same substrate, the temperature sensing element cannot be formed closely to the power element, and hence there is a problem in that an area occupied by an isolation region increases and an area of the semiconductor device thus increases in all modes of FIG. 4A to FIG. 4D. In the present invention, on the other hand, a distance for isolation is small, and hence an increase in area of the semiconductor device can be suppressed to be small.

In each of the arrangements of FIG. 4A to FIG. 4D, the temperature sensing element is surrounded by the power element, and hence there is an advantage in that a difference between a highest temperature of the power element and a temperature at the temperature sensing element is reduced.

The temperature difference is reduced more with the arrangement in which the power element is formed so as to surround only the temperature sensing element than with an arrangement in which the power element is formed so as to surround the temperature sensing element and a control circuit.

Figure 5:
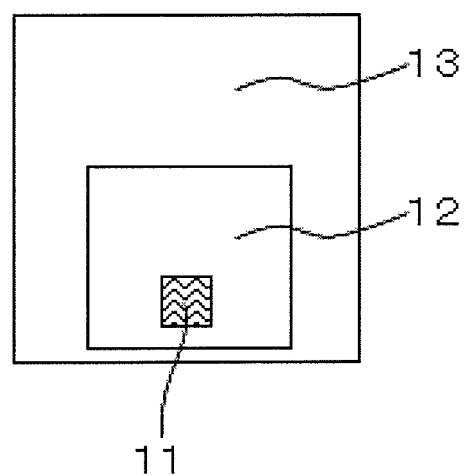
FIG. 5 is an arrangement plan view for illustrating a positional relationship between the power element and the temperature sensing element of the present invention on an entire chip.

In a case of other semiconductor devices than a semiconductor device dedicated for a power element, a power element is formed at a position shifted from the center of a chip. As illustrated in FIG. 5, a power element is generally formed at a position close to one side of a chip in many cases. In this case, the chip plays a role of a radiator, and hence a highest temperature point is located at a position closer to an end of the chip than the center of the power element. The highest temperature point is a point at which the temperature sensing element is formed in FIG. 5.

Seventh Embodiment

When charges due to noise and the like are injected into the semiconductor device, the noise is included in a temperature detection signal. In the present invention in which the resistor is formed, an influence of the noise may increase. In order to deal with this, based on a temperature detection signal, a delay function is provided to a circuit configured to control the power element so that the circuit controls the power element after the temperature detection signal is changed for a given period of time or more.

Eighth Embodiment

Figure 6:
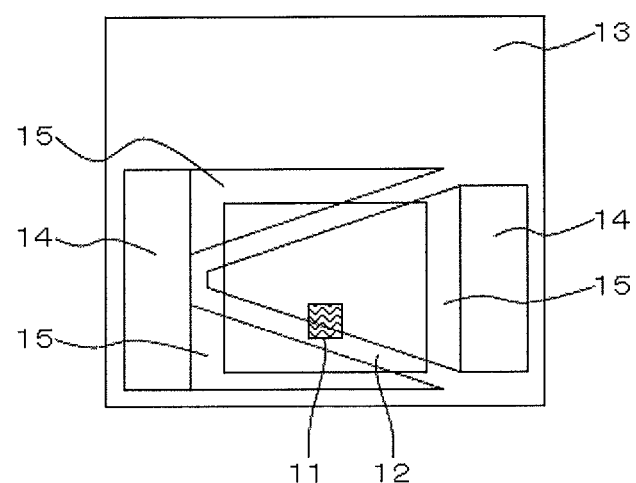
FIG. 6 is an arrangement view for illustrating a positional relationship between metal wiring of the power element and the temperature sensing element of the present invention.

As illustrated in FIG. 6, metal wiring 15 for connecting the power element 12 and pads 14 to each other is routed over the temperature sensing element 11. Because metal has better heat conductivity than the insulating film, routing the metal wiring, which is connected to the power element serving as the heat generating source, over the temperature sensing element reduces a temperature difference therebetween.

In the description above, for an easily understandable description, the semiconductor device including the P-type semiconductor substrate and the P-type power element is described. However, the present invention is not limited thereto.

Further, the configuration of the PN junction of the temperature sensing element is described with a case in which the P-type region is surrounded by the N-type region, but the present invention is not limited thereto. In order to electrically isolate a semiconductor substrate and a temperature sensing element from each other, the above-mentioned configuration is employed in a P-type substrate, whereas a temperature sensing element having a configuration in which an N-type region is surrounded by a P-type region is employed in an N-type substrate in many cases.

Further, a case in which the N-type region is connected to the ground potential VSS through the intermediation of the resistor is described, but the present invention is not limited thereto. The P-type region may be connected to the power supply potential VDD.

Further, a signal from the temperature sensing element is not limited to a potential difference from the ground potential VSS. The present invention can similarly be carried out when, for example, a potential difference from the power supply potential VDD is used as a signal.

What is claimed is:

1. A semiconductor device, comprising:
   a semiconductor substrate;
   a power element and a temperature sensing element formed adjacent to each other on the semiconductor substrate; and
   a resistor formed around the temperature sensing element,
   the temperature sensing element having a PN junction formed in the semiconductor substrate, the PN junction having a P-type region and an N-type region, one of the P-type region and the N-type region being connected to one of a ground potential VSS and a power supply potential VDD through an intermediation of the resistor,
   the power element having a recess for accommodating the temperature sensing element therein, none of a well, a source, a drain, and a gate electrode of the power element being formed in the recess.

2. A semiconductor device according to claim 1, wherein a resistance value of the resistor is from 50Ω or more to 200 kΩ or less.

3. A semiconductor device according to claim 1, wherein the resistor is formed of polycrystalline silicon.

4. A semiconductor device according to claims 1,
   wherein a first region having one polarity of the PN junction of the temperature sensing element is surrounded by a second region having another polarity of the PN junction of the temperature sensing element in plan view,
   wherein the second region is surrounded by a third region having the same polarity as the semiconductor substrate in plan view,
   wherein the second region has a second high concentration region having the same polarity as the second region,
   wherein the third region has a third high concentration region having the same polarity as the third region, and
   wherein at least part of the resistor is sandwiched between the second high concentration region and the third high concentration region.

5. A semiconductor device according to claim 4, wherein a width of the resistor is ½ or more of a distance between the second high concentration region and the third high concentration region.

6. A semiconductor device according to claims 1,
wherein the temperature sensing element has a rectangular shape, and
wherein at least two sides of the rectangular shape conform to an outer profile of the power element.

7. A semiconductor device according to claims 1,
wherein the temperature sensing element has a rectangular shape, and
wherein at least three sides of the rectangular shape conform to an outer profile of the power element.

8. A semiconductor device according to claims 1,
wherein the temperature sensing element has a rectangular shape, and
wherein at least four sides of the rectangular shape conform to an outer profile of the power element.

9. A semiconductor device according to claims 1, wherein a sum of a potential difference between both ends of the PN junction and a potential difference between both ends of the resistor is used as a temperature detection signal.

10. A semiconductor device according to claim 9, wherein the temperature detection signal is used to provide a delay function to a circuit configured to control the power element.

11. A semiconductor device according to claims 1, further comprising a pad,
wherein part of metal wiring for connecting the power element and the pad to each other is routed at least partially over the temperature sensing element.

* * * * *